(12) United States Patent
Farrar et al.

(10) Patent No.: US 7,301,221 B2
(45) Date of Patent: Nov. 27, 2007

(54) CONTROLLING DIFFUSION IN DOPED SEMICONDUCTOR REGIONS

(75) Inventors: Paul A. Farrar, Bluffton, SC (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 11/217,776

(22) Filed: Aug. 31, 2005

(65) Prior Publication Data

US 2006/0006499 A1    Jan. 12, 2006

Related U.S. Application Data

(62) Division of application No. 10/420,331, filed on Apr. 22, 2003.

(51) Int. Cl.
*H01L 31/0256* (2006.01)

(52) U.S. Cl. ............. 257/607; 257/E21.043; 257/E21.057; 257/E21.343; 438/546; 438/185; 438/514

(58) Field of Classification Search ........... 257/607; 438/185, 546
See application file for complete search history.

(56) References Cited

U.S. PATENT DOCUMENTS

| | | | |
|---|---|---|---|
| 3,812,519 A * | 5/1974 | Nakamura et al. ......... 257/607 |
| 4,111,719 A | 9/1978 | Mader et al. |
| 4,137,103 A | 1/1979 | Mader et al. |
| 4,155,785 A | 5/1979 | Cuomo et al. |
| 4,332,627 A | 6/1982 | Schmitt et al. |
| 4,369,072 A | 1/1983 | Bakeman et al. |
| 4,569,697 A | 2/1986 | Tsu et al. |
| 4,629,520 A | 12/1986 | Ueno et al. |
| 4,746,964 A | 5/1988 | Aronowitz |
| 4,769,689 A | 9/1988 | Lin |
| 4,778,772 A * | 10/1988 | Takahashi et al. ......... 438/371 |
| 4,851,360 A | 7/1989 | Haken et al. |
| 4,875,085 A | 10/1989 | Ueno et al. |
| 5,021,851 A | 6/1991 | Haken et al. |
| 5,116,455 A | 5/1992 | Daly |
| 5,212,101 A | 5/1993 | Canham et al. |

(Continued)

OTHER PUBLICATIONS

Darken, L S., et al., "Physical chemistry of metals", Book, Published New York, McGraw-Hill,(1953),74-90, 457-458.

(Continued)

*Primary Examiner*—Jerome Jackson
*Assistant Examiner*—Paul Budd
(74) *Attorney, Agent, or Firm*—Schwegman, Lundberg & Woessner, P.A.

(57) ABSTRACT

A method and device for reducing a dopant diffusion rate in a doped semiconductor region is provided. The methods and devices include selecting a plurality of impurity elements, including at least one dopant element. Selection of a plurality of impurity elements includes selecting a first impurity element with a first atomic radius larger than an average host matrix atomic radius and selecting a second impurity element with a second atomic radius smaller than an average host matrix atomic radius. The methods and devices further include selecting amounts of each impurity element of the plurality of impurity elements wherein amounts and atomic radii of each of the plurality of impurity elements complement each other to reduce a host matrix lattice strain.

26 Claims, 7 Drawing Sheets

U.S. PATENT DOCUMENTS

| | | |
|---|---|---|
| 5,231,298 A | 7/1993 | Daly |
| 5,245,208 A | 9/1993 | Eimori |
| 5,261,999 A | 11/1993 | Pinker et al. |
| 5,280,185 A | 1/1994 | Aronowitz et al. |
| 5,281,831 A | 1/1994 | Uemoto et al. |
| 5,311,055 A | 5/1994 | Goodman et al. |
| 5,345,104 A | 9/1994 | Prall et al. |
| 5,389,809 A | 2/1995 | Haken et al. |
| 5,510,630 A | 4/1996 | Agarwal et al. |
| 5,561,072 A | 10/1996 | Saito |
| 5,654,210 A | 8/1997 | Aronowitz et al. |
| 5,789,310 A | 8/1998 | Pramanick et al. |
| 5,814,541 A | 9/1998 | Shibata |
| 5,837,597 A | 11/1998 | Saito |
| 5,937,318 A | 8/1999 | Warner, Jr. et al. |
| 6,037,625 A | 3/2000 | Matsubara et al. |
| 6,133,082 A * | 10/2000 | Masuoka ............ 438/227 |
| 6,235,599 B1 | 5/2001 | Yu |
| 6,258,695 B1 | 7/2001 | Dunn et al. |
| 6,368,928 B1 * | 4/2002 | Wang et al. ............ 438/307 |
| 6,437,374 B1 | 8/2002 | Northrup et al. |
| 6,455,402 B2 | 9/2002 | Lee et al. |
| 6,518,150 B1 | 2/2003 | Matsumoto |
| 6,576,521 B1 | 6/2003 | Chaudhry et al. |
| 6,696,341 B1 * | 2/2004 | Sonoda ............ 438/285 |
| 6,797,593 B2 | 9/2004 | Chakravarthi et al. |
| 6,930,360 B2 | 8/2005 | Yamauchi et al. |
| 6,991,972 B2 | 1/2006 | Lochtefeld et al. |
| 2002/0063294 A1 | 5/2002 | Brown et al. |
| 2003/0013260 A1 | 1/2003 | Gossmann et al. |
| 2003/0087510 A1 | 5/2003 | Chen |
| 2004/0038468 A1 | 2/2004 | Hwang et al. |
| 2005/0026403 A1 | 2/2005 | Lee et al. |
| 2006/0003535 A1 | 1/2006 | Farrar et al. |
| 2006/0003559 A1 | 1/2006 | Farrar et al. |

OTHER PUBLICATIONS

Eldridge, J M., et al., "Lowering stresses in silicon due to the presence of high concentration of N-type dopant", *IBM Technical Disclosure Bulletin*, vol. 14, No. 10, (1972),3013-14.

Swalin, R A., "Thermodynamics of solids", Book, Published New York, Wiley Series: Wiley series on the science and technology of materials,(1962),149-155.

Trumbore, F A., "Solid Solubilities of Impurity Elements in Germanium and Silicon", *The Bell System Technical Journal*, 39, I.M. Mackintosh unpublished data is quoted by F.A. Trumbore in this article.,(1960),205-233.

* cited by examiner

CONTROLLING DIFFUSION IN DOPED SEMICONDUCTOR REGIONS

CROSS-REFERENCE TO RELATED APPLICATIONS

The present application is a divisional of U.S. application Ser. No. 10/420,331, filed Apr. 22, 2003, which is incorporated herein by reference in its entirety.

TECHNICAL FIELD

This invention relates to semiconductor devices and semiconductor device fabrication. Specifically this invention relates to a method and apparatus of doping semiconductor regions and diffusion of dopants during semiconductor processing.

BACKGROUND

As the minimum feature size achievable in semiconductor manufacturing decreases, the diffusion rates of dopants become a significant impediment for achieving desired device structures and corresponding performances. Unfortunately there are only a limited number of possible solutions for this problem. As the minimum feature size decreases, the number of devices that can be formed in a given area increases with the inverse square of this feature size while dopant diffusion rates remain constant. As the areal density of devices is raised, both the device size and inter-device distances must shrink accordingly. In addition, as device areas have been shrunken laterally, optimal dopant diffusion depths have been substantially decreased.

Using current processing methods, dopant diffusion depth is largely affected by annealing operations, typically performed subsequent to an implant step. Thermal annealing is performed for a number of reasons, including activation of implanted dopant ions. Annealing also causes diffusion of the dopant species. Depending on the device design requirements and processes, the resulting redistribution of the as-implanted dopant ions can be unacceptably large.

What is needed is a method to control diffusion of dopant species in a matrix lattice. What is also needed is a device with a sharper diffusion gradient of dopant elements. What is also needed is a device capable of withstanding higher processing temperatures for longer periods of time without unacceptable diffusion of dopant elements.

SUMMARY

A method of reducing a dopant diffusion rate in a doped semiconductor region is shown. The method includes selecting a plurality of impurity elements including at least one dopant element. Selecting the plurality of impurity elements also includes selecting a first impurity element with a first atomic radius larger than an average host matrix atomic radius, and selecting a second impurity element with a second atomic radius smaller than an average host matrix atomic radius. Amounts of each impurity element of the plurality of impurity elements are selected so that amounts and atomic radii of each of the plurality of impurity elements complement each other to reduce a host matrix lattice strain. The method further includes introducing the plurality of impurity elements to a selected region of the host matrix and annealing the selected region of the host matrix. Impurity dopants can be used that do not become electrically active upon annealing. Such impurities are to be differentiated from other dopant impurities that do become electrically active upon annealing.

Devices formed by methods of reducing a dopant diffusion rate are also shown. Example devices include junctions, transistors, memory devices, and information handling devices.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
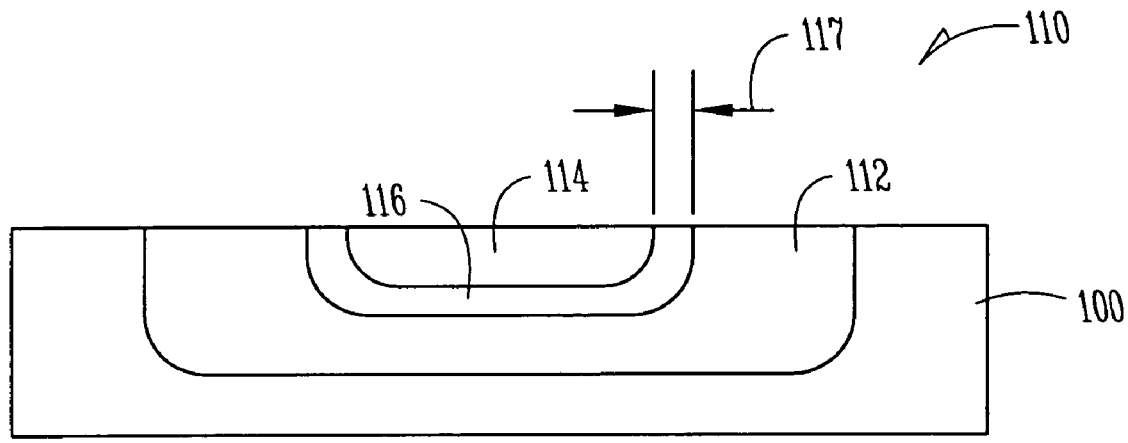
FIG. 1A shows a prior diffusion profile within a doped semiconductor region.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled. The term host matrix refers to a material as used in a composite structure such as a semiconductor matrix with dopant impurities. One example of a host matrix includes, but is not limited to, a semiconductor wafer. The term host lattice refers to a structure or regular pattern of atoms within the host matrix.

In semiconductor processing, diffusion is normally thought of as occurring by the random motion of atoms with the energy being thermal, with the driving force being a function of temperature and concentration. Therefore the higher the temperature, the more rapid the diffusion rate. However, it has been discovered that the rate of diffusion of one element in another is a function of not only temperature but other factors such as crystal defects, in the host matrix. The process of implanting an impurity ion (e.g., As) into a host matrix (such as Si) is sufficiently energetic as to displace the host matrix atoms from their normal lattice sites, thereby introducing localized strains. Such strains serve to increase the diffusion of the implanted ions during subsequent annealing treatments. Rates of diffusion at grosser defects such as grain boundaries may be far larger than an order of magnitude of that in the bulk material.

FIG. 1A shows a semiconductor substrate 100 with a junction 110 formed by ion implantation of a dopant in a portion of the semiconductor substrate 100. In one embodiment, the junction 110 is formed within a well region or pocket 112 that is also formed in a portion of the semiconductor substrate 100. A second, shallower pocket 114 is formed in pocket 112 by ion implantation. As noted above, the ion implanted dopants are subsequently activated by an annealing treatment as high temperatures. The annealing also causes the dopant element to diffuse vertically and laterally into the pocket 112 so that it forms a larger pocket 116. As device geometries continue to shrink with advancing technologies, this increase in pocket size (from 114 to 116) will be unacceptably large.

Figure 1B:
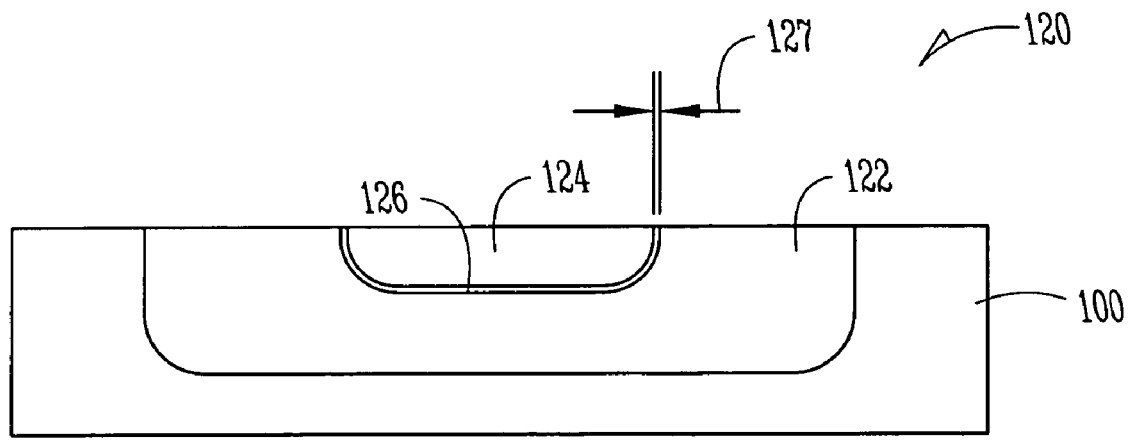
FIG. 1B shows a diffusion profile within a doped semiconductor region according to one embodiment of the invention.

FIG. 1B depicts schematically the much-smaller increase in pocket size (from 124 to 126) upon annealing the pocket 124 formed according to the teachings of this invention. A semiconductor substrate 100 is shown with a junction 120 formed in a portion of the semiconductor substrate 100. Similar to FIG. 1A, in one embodiment, the junction 120 is formed within a well region or pocket 122 that is also formed in a portion of the semiconductor substrate 100. Using novel methods that will be described below, dopant elements are introduced to a first region 124. Following an annealing procedure, dopant elements are driven by diffusion from the first region 124 to a diffused region 126. As shown by FIG. 1B, the diffused region 126 shows a steeper diffusion profile with a smaller diffusion depth 127. It should be noted that FIGS. 1A and 1B are diagrams for illustration of differences between junctions in prior configurations in contrast to junctions after using the methods described below. FIGS. 1A and 1B are not necessarily drawn to scale.

Figure 2A:
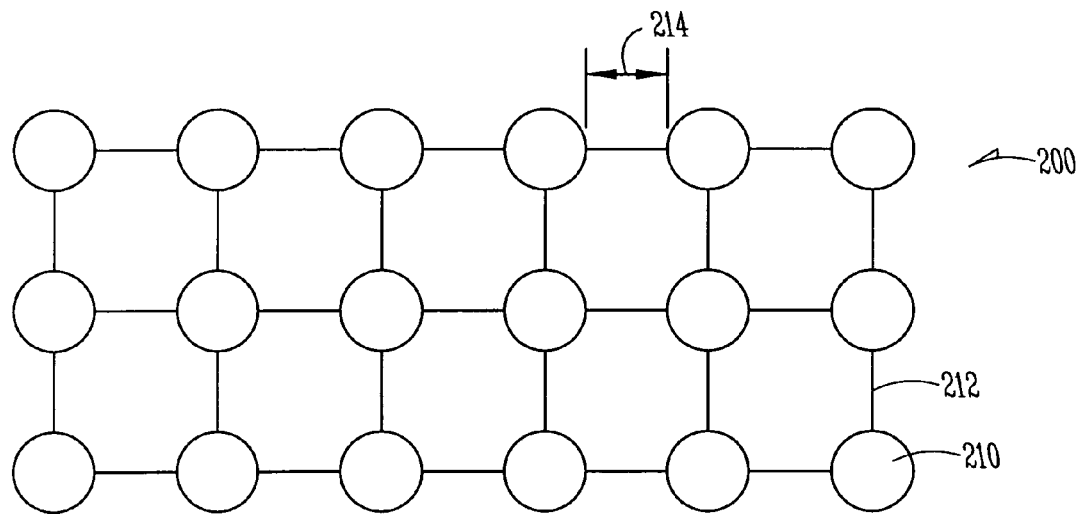
FIG. 2A shows a model of an undistorted semiconductor material according to one embodiment of the invention.

FIG. 2A shows one embodiment of a host semiconductor lattice 200. The lattice 200 is made up of a number of host atoms 210 that are held together by bonds 212. Although a two dimensional lattice is shown for illustration, one of ordinary skill in the art will recognize that the concepts illustrated in FIGS. 2A-2C apply to three dimensional lattices. In one embodiment, the host semiconductor lattice 200 is made up of silicon atoms. Although a silicon host semiconductor lattice 200 is used as an example, other host semiconductor lattice compositions such as gallium arsenide, indium phosphide, carbon containing host matrices, etc. are within the scope of the invention. In one embodiment, the host semiconductor lattice 200 is structured in a regular patterned crystalline form. In a crystal, the bonds 212 are arranged in a regular pattern throughout the lattice 200. For illustration purposes, the bonds 212 are shown with equal bond lengths 214.

Although in one embodiment, all bonds 212 are substantially the same length 214, other embodiments are included where bond lengths 214 vary within the lattice 200 to form an energetically favorable atomic stacking arrangement in the host lattice 200. In describing a lattice 200, as illustrated in FIG. 2A, individual atoms 210 can be described as hard spheres that can be stacked a number of ways. A number of regular patterns of atomic stacking are therefore possible, some with equal bond lengths 214 and some with repeating variations in bond lengths 214, depending on the atomic composition and solid phase of the host matrix.

Figure 2B:
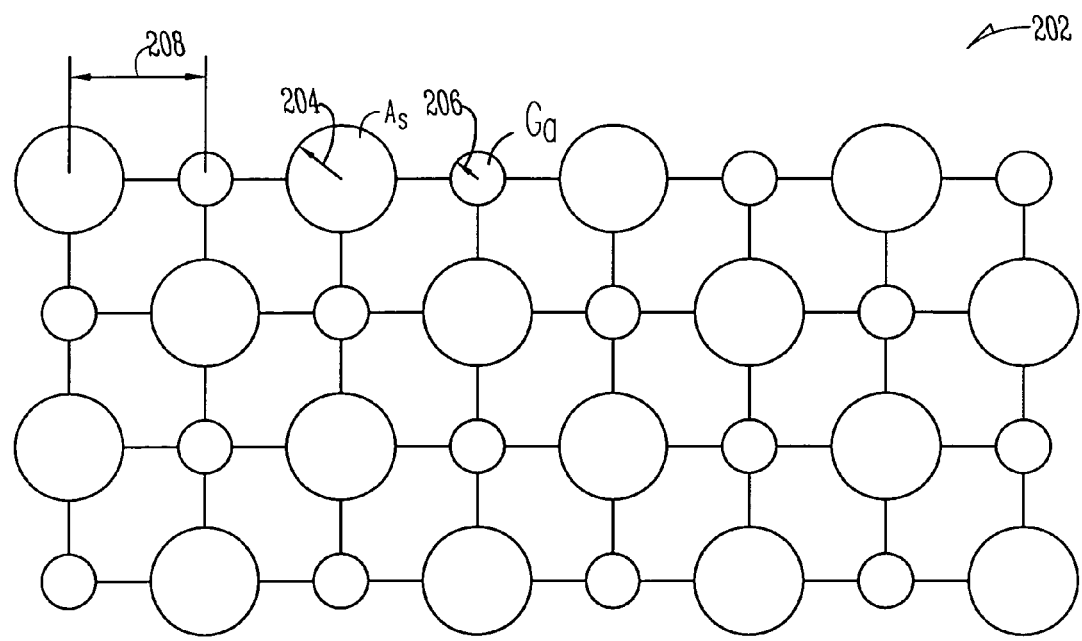
FIG. 2B shows a model of an undistorted two element semiconductor material according to one embodiment of the invention.

FIG. 2B shows a regular pattern semiconductor lattice that includes two different semiconductor atoms such as gallium and arsenic to form a host lattice 202. In one embodiment, other pairs of elements from group 3 and group 5 of the periodic table are chosen to form the host lattice 202. In one embodiment, pairs of elements from group 2 and group 6 of the periodic table are chosen to form the host lattice 202. The host lattice 202 includes an average host radii equal to (radius 204+radius 206)/2. The host lattice can also be defined by a lattice constant 208. Embodiments as described in the present specification can be used with a host lattice as described in FIG. 2A, FIG. 2B or other substantially crystalline semiconductor lattices.

Dopant elements used to form the junctions in a silicon transistor are substitutional (i.e., occupy lattice sites normally occupied by host lattice atoms). Since the radii of dopant ions differ from that of the host matrix, the resulting differences in size imparts strain to the doped semiconductor region. This strain becomes especially large as the dopant concentration is raised to the levels needed to form the necessary junctions.

Figure 2C:
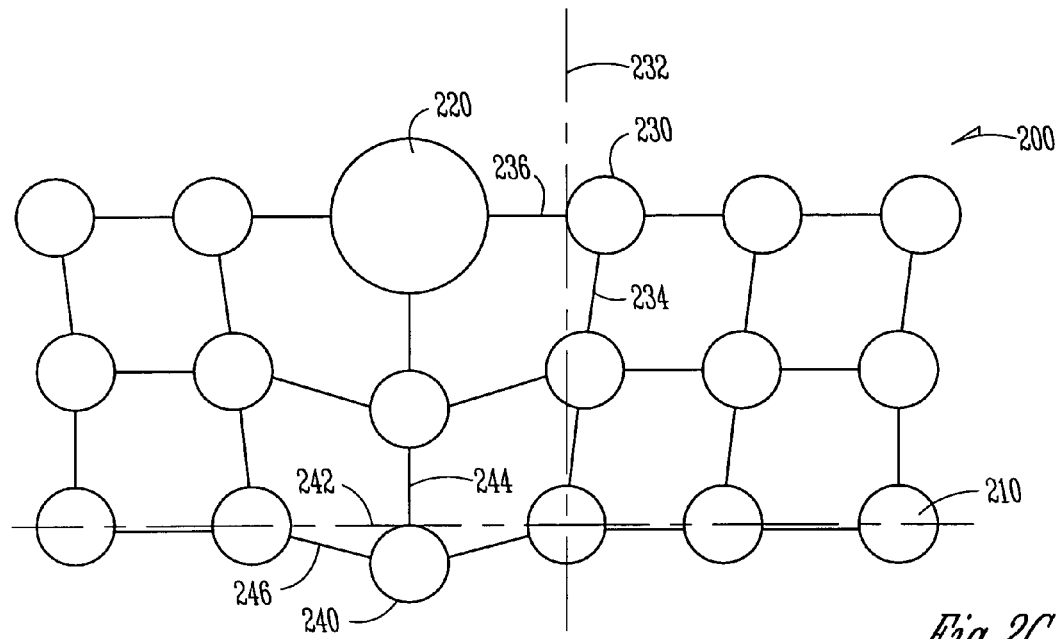
FIG. 2C shows a model of a doped semiconductor material which was doped using a conventional single dopant process.

FIG. 2C illustrates the host matrix 200 from FIG. 2A with the addition of a dopant atom 220. As discussed above, the dopant atom 220 is located in a substitutional lattice site. The dopant atom 220 causes lattice strain, thus distorting the regular pattern of the host lattice 200 that existed when the dopant atom 220 was not present. Host atom 230 has been moved from an unstrained position on line 232 to a strained location, thus distorting bonds 234 and 236. As can be seen from the Figure, other host atoms and bonds are similarly distorted. The effect of lattice strain is not limited to the host atoms directly adjacent to the dopant atom 220. Host atom 240 has been moved from an unstrained position on line 242 to a strained location, thus distorting bonds 244 and 246.

Although FIG. 2C shows a dopant atom 220 with an atomic radius that is larger than the atomic radius of the host matrix atoms, a dopant atom 220 with an atomic radius that is smaller than the atomic radius of the host matrix atoms causes similar lattice distortion. Instead of the bonds such as 234 and 236 being compressed, the bonds adjacent to a smaller dopant atom are stretched, thus causing host lattice distortion. It has been discovered that such dopant-induced strains provide a driving force to cause enhanced, non-random diffusion effects. To reduce unwanted diffusion, it therefore follows that the net lattice strain in a junction should be at or near zero.

This can be achieved by adding one or more additional type(s) of impurity atoms to the structure. If the added atoms are of a neutral species (i.e. carbon or germanium can be used in a silicon based structure), then only the relative atomic sizes must be considered. If however the compensating impurity element is of the opposite type, i.e. N instead of P type, then the compensating atom must have a larger difference in atomic size, from the matrix atom(s), than the chosen dopant. If the chosen dopant is larger in atomic size than the matrix atom, then the compensating dopant must be smaller. The amount of the compensating dopant is chosen such that the net effect of all of the dopant atoms is to produce no net change in the average atomic spacing. If the compensating dopant is of the opposite type, then the net charge will be the effective doping level. If the matrix structure is a compound semiconductor then silicon, carbon and germanium may then be used as neutral compensating elements.

In one embodiment, no net change in the average atomic spacing can be achieved by using two or more impurity elements in each junction. At least one of the impurity elements is chosen with an atomic size smaller than an average host lattice atomic size, and the other of the impurity elements is chosen with an atomic size larger than an average host lattice atomic size. Necessarily for electrical operation of the junction, at least one of the impurity elements chosen is a dopant element, although in some embodiments, other impurity elements are not dopant elements. In selecting the impurity elements, an average host lattice atomic size is used for comparison in semiconductor lattices using two or more elements such as GaAs or InP. In a silicon host lattice, the atomic size of silicon is used for comparison in choosing the impurity element sizes. The percentages of each impurity element is chosen such that the net size effect in the host lattice approaches zero.

Figure 2D:
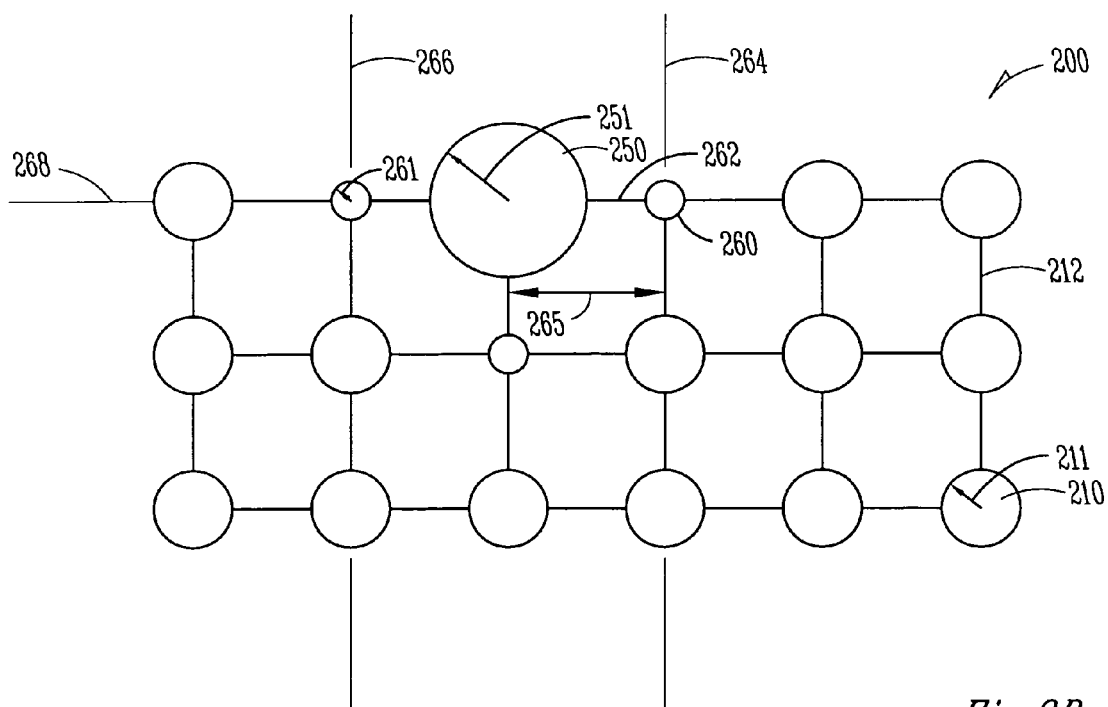
FIG. 2D shows another model of a doped semiconductor material according to one embodiment of the invention.

FIG. 2D shows the host matrix 200 with the addition of multiple impurity atoms. In one embodiment, the multiple impurity atoms include a first impurity atom 250 with an atomic radius 251 that is larger than an atomic radius 211 of host atoms 210. In one embodiment, the multiple impurity atoms further include a second impurity atom 260 with an atomic radius 261 that is smaller that the atomic radius 211 of host atoms 210. As illustrated in FIG. 2D, the use of at least two complementary sized impurity elements reduces lattice strain.

In one embodiment, at least two impurity elements chosen include two dopant elements of the same conductivity type such as P-type or N-type. Examples of suitable N-type dopant atoms include, but are not limited to, arsenic (As), phosphorus (P), Bismuth (Bi), and Antimony (Sb). Examples of suitable P-type dopant atoms include, but are not limited to, Aluminum (Al) and Boron (B).

In one embodiment, a specific proportion of impurity atoms is further chosen for introduction to the lattice 200. When a specific combination of multiple impurity atoms is used at a specific proportion, strain in the lattice 200 is reduced significantly. As shown in FIG. 2D, the larger radius 251 of the first impurity atom 250 complements the smaller radius 261 of the second impurity atom 260. In contrast to the lattice distortion shown in FIG. 2C, atoms in the lattice, including both host matrix atoms and impurity atoms, are substantially lined up as in the unstressed state of FIG. 2A. Impurity atom 260 is shown along substantially undistorted lines 264 and 268, and impurity atom 261 is shown along substantially undistorted lines 266 and 268. Although selected bonds such as bond 262 in the doped lattice 200 of FIG. 2D may be shorter or longer than host matrix bonds 212, a center to center spacing 265 is approximately equal to that of the undistorted host matrix.

Although FIG. 2D shows the larger first impurity atom 250 bonded adjacent to the smaller second impurity atom 260 this specific configuration is for illustration only. When multiple impurity atoms are selected and introduced to the host lattice 200 in the correct proportions, lattice strain is minimized regardless of which host lattice sites the multiple impurity atoms are located on. Small impurity atoms do not necessarily have to be directly bonded to large impurity atoms. On a macroscopic scale, an average lattice strain is reduced due to the size of impurity atoms selected and the proportion in which they are introduced.

As noted above, more than two impurity elements are used in selected embodiments in size complementing proportions to reduce lattice strain. Use of more than two impurity elements provides an increased number of options for strain reduction in the host lattice. Combinations of three or more impurity elements in specific proportions can provide a better complementary size matching that further reduces lattice strain.

In a two impurity atom embodiment, the proportions of impurity atoms can be chosen by the following formula:

$$x=(R_H-R_S)/[(R_L-R_H)+(R_H-R_S)]$$

Where:

$R_H$=the atomic radius of a host atom $R_L$=the atomic radius of the impurity atom that is larger than the host atom $R_S$=the atomic radius of the impurity atom that is smaller than the host atom x=the fraction of large impurity atoms to introduce to the host lattice 1−x=the fraction of small impurity atoms to introduce to the host lattice For example, if the host atom has a relative radius of 2, the large impurity atom has a relative radius of 6, and the small impurity atom has a relative radius of 1, then "x" would equal 0.20 and "1 −x" would equal 0.80. A resulting impurity proportion would include one large impurity atom for every four small impurity atoms. Similarly, if three or more impurity atoms are used, the proportion of impurity atoms that are larger than the host matrix atoms should compensate for the proportions of impurity atoms that are smaller that the host matrix atoms, while taking into consideration the relative sizes of the impurity atoms and the host matrix atoms.

In one embodiment for making an N-type junction, both arsenic (As) and phosphorus (P) are used as dopants. To compensate for the atomic radii of the dopant atoms, approximately 36.37 percent of the dopant concentration is phosphorus and approximately 63.63 percent of the dopant concentration is arsenic. In one embodiment for making a P-type junction, both boron (B) and aluminum (Al) are used as dopants. To compensate for the atomic radii of the dopant atoms, approximately 23.68 percent of the dopant concentration is boron and approximately 76.32 percent of the dopant concentration is aluminum.

In one embodiment, at least two impurity elements chosen include two dopant elements of opposite conductivity type such as P-type or N-type. The use of elements of opposite conductivity type further increases the atomic size options of the impurity elements chosen. Increased atomic size options allows for better lattice strain reduction options in a larger number of junction designs.

Because a net charge effect is desired in a doped junction, when using two or more dopant elements of opposite conductivity type, a dopant element amount of the desired conductivity type is selected to be larger than the dopant element amount of the opposite conductivity type. The difference in dopant element amounts provides a net charge effect for junction operational characteristics, while the complementary atomic sizes reduce lattice strain.

In one embodiment, at least two impurity elements are chosen, including a dopant element of the desired conductivity type, and an electrically inactive impurity element. The use of electrically inactive impurity elements serves the purpose of providing increased options for reducing lattice strain, while the net charge of the junction remains unaffected by the electrically inactive element. Possible electrically inactive impurity elements (for use in a silicon host matrix for example) include, but are not limited to carbon, and germanium. In one embodiment, two or more electrically inactive impurity elements are used to reduce the lattice strain. In one embodiment, at least one electrically inactive element is used with two or more dopant elements of the same conductivity type to reduce lattice strain. In one embodiment, at least one electrically inactive element is used with two or more dopant elements of opposite conductivity type to reduce lattice strain.

In one embodiment, introduction of the multiple dopant atoms to the host lattice 200 includes an ion implantation process. As discussed above, following ion implantation, there is damage to the host lattice that must be repaired. Further, the implanted dopant atoms must be activated to realize their desired electrical properties. In one embodiment, an anneal step is performed following introduction of the dopant atoms to the host lattice. In one embodiment, a rapid thermal anneal process is used following introduction of the dopant atoms to the host lattice. By choosing a combination of multiple dopant atoms, introduced to a host lattice at a specific proportion as described above, the post anneal doped region exhibits significantly reduced lattice strain. The reduced lattice strain significantly reduces unwanted enhanced, non-random diffusion effects.

One advantage of methods described above is that the methods effectively reduce the rate of diffusion of the doping elements in very shallow junctions so that they can be exposed to a higher time temperature envelope without excessive degradation of the structure. Another advantage of methods described above is that the methods sharpen a junction profile by reducing diffusion rates at current anneal times and temperatures. A further advantage of methods described above is that solubility in doped regions will be increased. Thus allowing for a higher maximum doping level.

Figure 3:
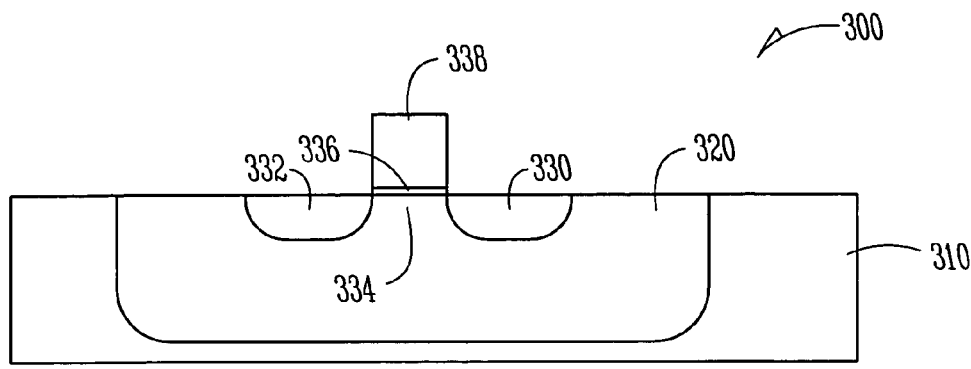
FIG. 3 shows an example of a semiconductor device according to one embodiment of the invention.

FIG. 3 shows one example of a device that is formed using the methods described above. FIG. 3 shows a transistor 300 formed in a semiconductor substrate 310. Other devices apart from transistors may also be formed using the methods described above. In one embodiment, the transistor is further formed in a doped pocket 320. The transistor 300 includes a first source/drain region 330, a second source/drain region 332, and a channel region 334 separating the first and second source/drain regions 330, 332. A gate 338 is formed over the channel region 334, with a gate oxide 336 separating the channel region 334 from the gate 338.

In one embodiment, the first and second source/drain regions 330, 332 are formed using the multiple impurity implant methods described above. In one embodiment including a doped pocket 320, the doped pocket 320 is also formed using the multiple impurity methods described above. In one embodiment, the doped pocket 320 is formed using multiple impurity atoms of a type that is complementary to the source/drain regions. In one embodiment, the source/drain regions 330/332 include at least one P-type dopant atom, and the pocket 320 includes at least one N-type dopant atom. In one embodiment, the source/drain regions 330/332 include at least one N-type dopant atom, and the pocket 320 includes at least one P-type dopant atom.

The following is an example of process conditions in one embodiment of an N-type junction in a P-type pocket using at least two dopant elements of the same conductivity type as impurity elements. Where the desired junction depth is approximately 500 Angstroms and the pocket depth is approximately 2,000 Angstroms, the P pocket would be constructed using a 135 KEV aluminum and a 60 KEV boron ion implant energy. If the total concentration of the pocket was to be $10^{20}/cm^3$, then a $0.7632 \times 10^{20}$ aluminum concentration would be used and a $0.2368 \times 10^{20}/cm^3$ boron concentration would be used. The 500 Angstrom N-type junction would be constructed using a 40 KEV phosphorus and a 70 KEV arsenic ion implant energy. It the total concentration of the diffusion was to be $5 \times 10^{20}/cm^3$, then the phosphorus concentration would be $1.82 \times 10^{20}/cm^3$ and the arsenic concentration would be $3.18 \times 10^{20}/cm^3$.

The following is an example of process conditions in one embodiment of an N-type junction using at least two dopant elements of opposite conductivity type as impurity elements. Where the desired junction depth is approximately 500 Angstroms the N-type junction would be constructed using a 14 KEV boron and a 70 KEV arsenic deposition. If the total concentration of the diffusion was to be $5 \times 10^{20}$, then the boron concentration would be $0.81 \times 10^{20}$ and the arsenic concentration would be $5.81 \times 10^{20}$.

The following is an example of process conditions in one embodiment of an N-type junction using at least two impurity elements where one impurity element includes a dopant element and the other impurity element includes an electrically inactive element. Where the desired junction depth is approximately 500 Angstroms the N-type junction would be constructed using a 17 KEV carbon and a 70 KEV arsenic deposition. If the total concentration of the diffusion was to be $5 \times 10^{20}$, then the carbon concentration would be $0.50 \times 10^{20}$ and the arsenic concentration would be $5.0 \times 10^{20}$.

The following is an example of process conditions in one embodiment of an P-type junction using at least two impurity elements where one impurity element includes a dopant element and the other impurity element includes an electrically inactive element. Where the desired junction depth is approximately 500 Angstroms the P-type junction would be constructed using a 65 KEV germanium and a 14 KEV boron deposition. If the total concentration of the diffusion was to be $5 \times 10^{20}$, then the germanium concentration would be $3.3 \times 10^{21}$ and the boron concentration would be $5.0 \times 10^{20}$.

Diffusion of dopant atoms in a junction is significantly reduced when both a pocket and a region within a pocket are formed using multiple impurity atoms that are selected and proportioned as described in embodiments above. Junctions can be used to form devices that include, but are not limited to transistors, capacitors, etc.

Figure 4:
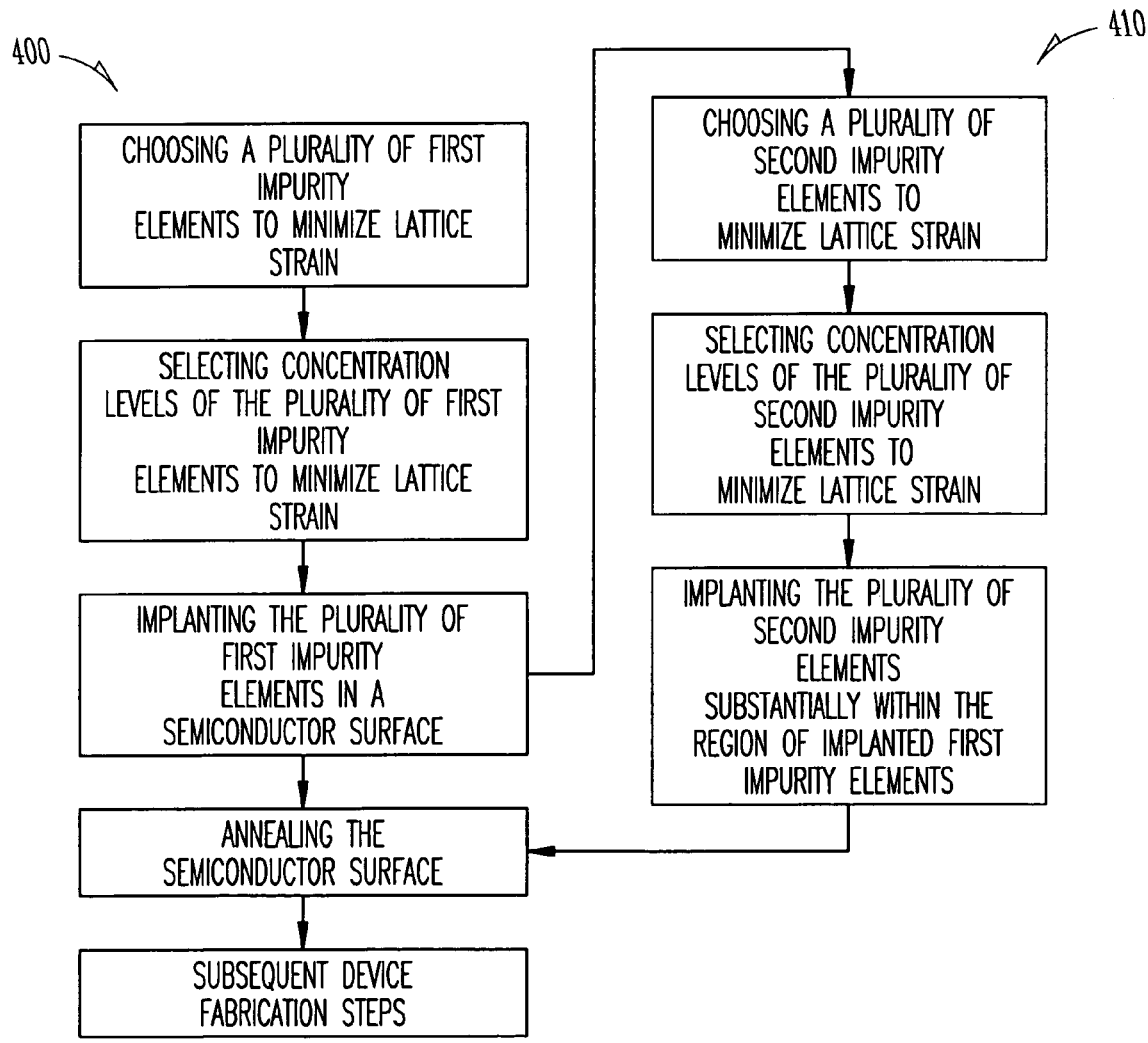
FIG. 4 shows a flow diagram according to one embodiment of the invention.

FIG. 4 shows a flow diagram of a method of fabricating a junction in a semiconductor device. A first flow 400 includes operations for forming a region using multiple impurity atoms to reduce lattice strain as described in embodiments above. A second flow 410 is included in one embodiment to include forming a doped region within another doped region. Both methods are effective to significantly reduce diffusion rates of dopant elements during processing steps such as annealing.

Figure 5:
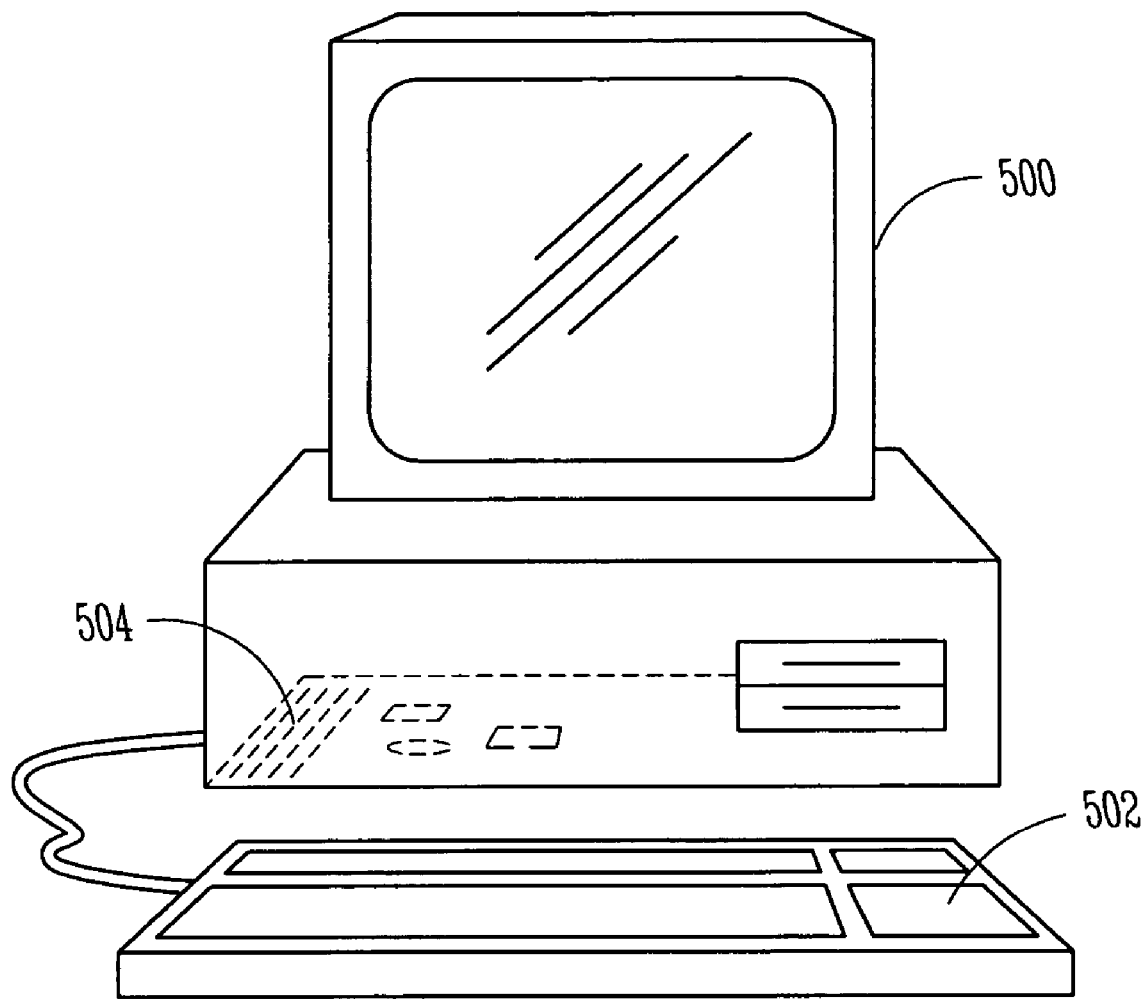
FIG. 5 shows an information handling system according to one embodiment of the invention.
Figure 6:
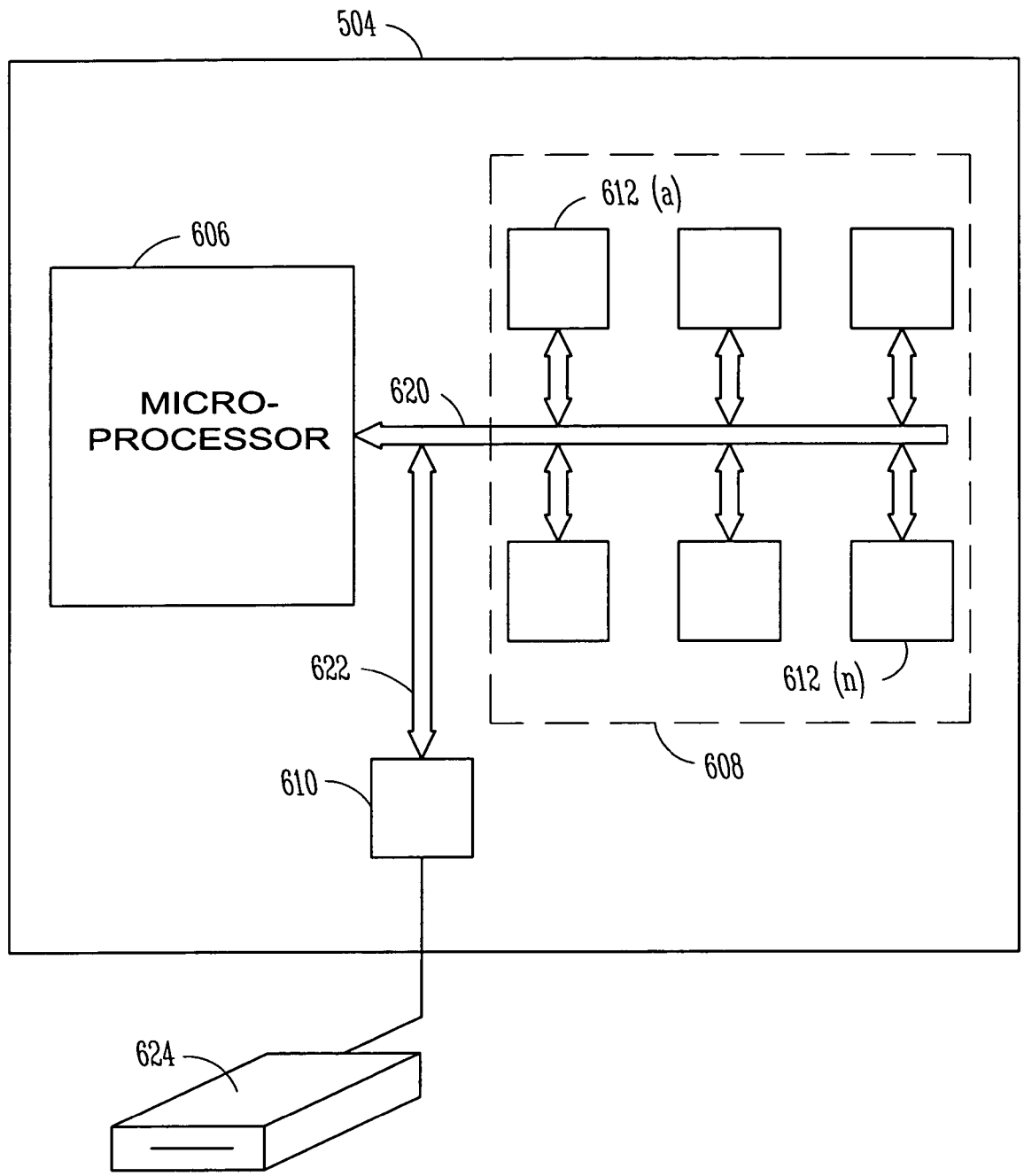
FIG. 6 shows a block diagram of a processing unit according to one embodiment of the invention.
Figure 7:
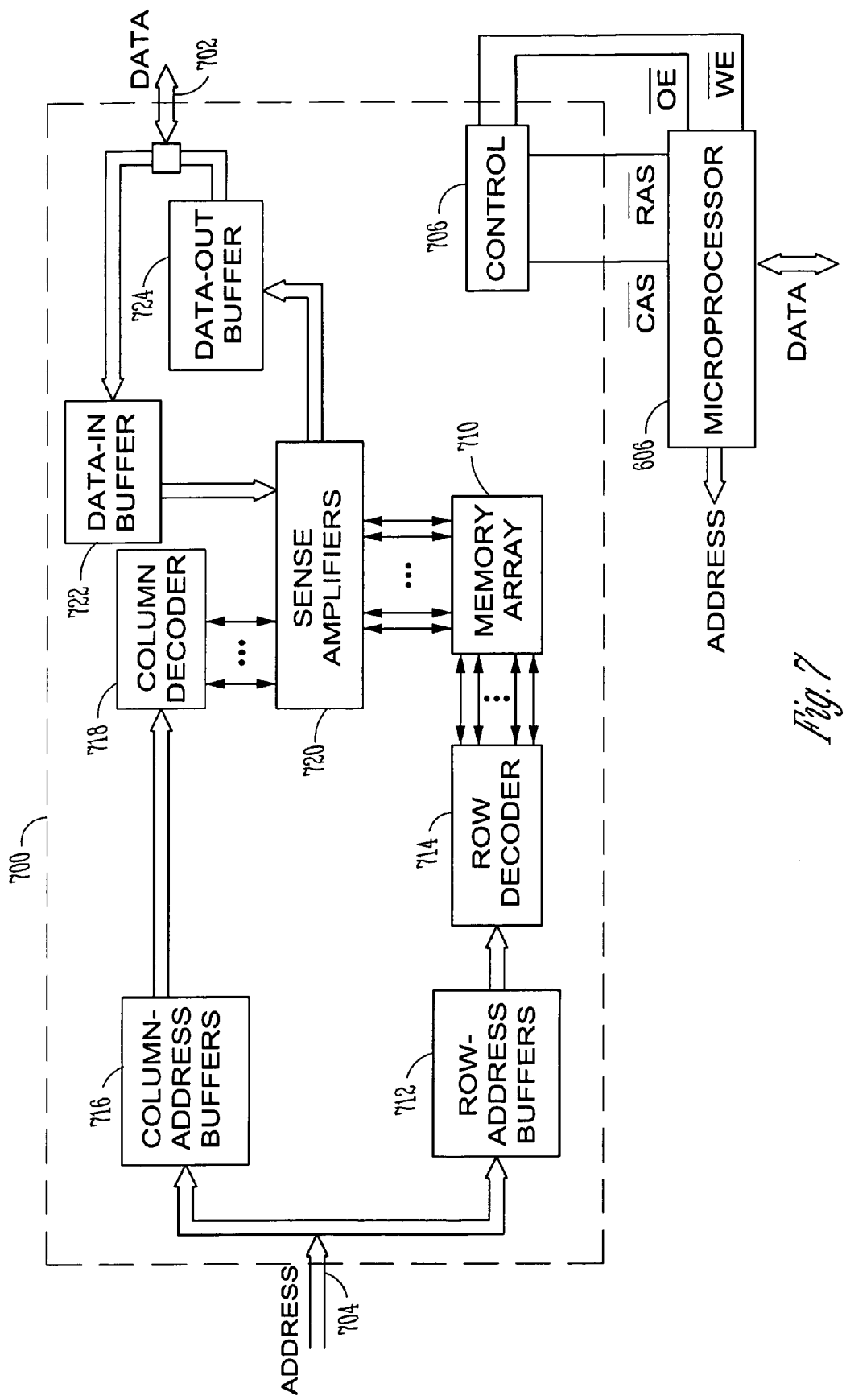
FIG. 7 shows a block diagram of a memory device according to one embodiment of the invention.

Semiconducting wafers, semiconductor devices, and IC's created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(*a-n*), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(*a-n*) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. An alternate type of device is the extended data output (EDO) memory. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(*a-n*). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

Devices and methods described above include advantages such as effective reduction in the rate of diffusion of the doping elements in very shallow junctions. The junctions can be exposed to a higher time temperature envelope without excessive degradation of the structure. Another advantage of devices and methods described above is that the methods sharpen a junction profile by reducing diffusion rates at current anneal times and temperatures. A further advantage of devices and methods described above is that solubility in doped regions will be increased. Thus allowing for a higher maximum doping level.

Diffusion of dopant atoms in a junction is further reduced when both a pocket and a region within a pocket are formed using multiple impurity atoms that are selected and proportioned as described in embodiments above. Junctions can be used to form devices that include, but are not limited to transistors, capacitors, etc.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A semiconductor junction, comprising:
a first conductivity type semiconductor region, wherein the first conductivity type semiconductor region includes a first group of three or more impurity elements, wherein at least one of the first group of impurity elements includes a first wherein the first group of impurity elements are chosen with complementary radii in respective amounts where a weighted average dopant atomic radius in the first group of impurity elements is substantially equal to an average atomic radius of an undoped host semiconductor lattice;
a second conductivity type semiconductor region located substantially within the first conductivity type semiconductor region, wherein the second conductivity type semiconductor region includes a second group of three or more impurity elements,
wherein in the second group of impurity elements are chosen with complementary radii in respective amounts where a weighted average dopant atomic radius in the second group of impurity elements is substantially equal to an average atomic radius of an undoped host semiconductor lattice.

2. The semiconductor junction of claim 1, wherein the first conductivity type semiconductor region includes at least a pair of dopant elements of the same conductivity type.

3. The semiconductor junction of claim 1, wherein the first conductivity type semiconductor region includes at least a pair of dopant elements of an opposite conductivity type.

4. The semiconductor junction of claim 1, wherein the first conductivity type semiconductor region includes at least one dopant element and at least one electrically inactive element.

5. A transistor, comprising:
a first conductivity type semiconductor region, wherein the first conductivity type semiconductor region includes a first group of three or more impurity elements, wherein at least one of the first group of impurity elements includes a first conductivity type dopant element, and wherein the first group of impurity elements are chosen with complementary radii in respective amounts where a weighted average dopant atomic radius in the first group of impurity elements is substantially equal to an average atomic radius of an undoped host semiconductor lattice;
a pair of source/drain regions of a second conductivity type located substantially within the first conductivity type semiconductor region, wherein the pair of source/drain regions include a second group of three or more impurity elements, wherein at least one of the second group of impurity elements includes a second conductivity type dopant element, and wherein the second group of impurity elements are chosen with complementary radii in respective amounts where a weighted average dopant atomic radius in the second group of impurity elements is substantially equal to an average atomic radius of an undoped host semiconductor lattice;
a channel region located between the pair of source/drain regions; and
a gate located adjacent to the channel region.

6. The transistor of claim 5, wherein the first conductivity type semiconductor region includes at least a pair of dopant elements of the same conductivity type.

7. The transistor of claim 5, wherein the first conductivity type semiconductor region includes at least a pair of dopant elements of an opposite conductivity type.

8. The transistor of claim 5, wherein the first conductivity type semiconductor region includes at least one dopant element and at least one electrically inactive element.

9. A semiconductor junction, comprising:
a first conductivity type semiconductor region, wherein the first conductivity type semiconductor region includes at least a first pair of impurity elements, wherein at least one of the first pair of impurity elements includes a first conductivity type dopant element, wherein a fraction of a large impurity element in the first pair of impurity elements is chosen by the formula $x=(R_H-R_S)/[(R_L-R_H)+(R_H-R_S)]$ and a fraction of a small impurity element is chosen by the formula $1-x$;
a second conductivity type semiconductor region located substantially within the first conductivity type semiconductor region, wherein the second conductivity type semiconductor region includes at least a second pair of impurity elements, wherein at least one of the second pair of impurity elements includes a second conductivity type dopant element, wherein a fraction of a large impurity element in the second pair of impurity elements is chosen by the formula $x=(R_H-R_S)/[(R_L-R_H)+(R_H-R_S)]$ and a fraction of a small impurity element is chosen by the formula $1-x$; and wherein there is substantially no lattice stress in the first conductivity type semiconductor region or the second conductivity type semiconductor region.

10. The semiconductor junction of claim 9, wherein the first conductivity type semiconductor region includes at least a pair of dopant elements of the same conductivity type.

11. The semiconductor junction of claim 9, wherein the first conductivity type semiconductor region includes at least a pair of dopant elements of an opposite conductivity type.

12. The semiconductor junction of claim 9, wherein the first conductivity type semiconductor region includes at least one dopant element and at least one electrically inactive element.

13. A transistor, comprising:
a first conductivity type semiconductor region, wherein the first conductivity type semiconductor region includes at least a first pair of impurity elements, wherein at least one of the first pair of impurity elements includes a first conductivity type dopant element, wherein a fraction of a large impurity element in the first pair of impurity elements is chosen by the formula $x=(R_H-R_S)/[(R_L-R_H)+(R_H-R_S)]$ and a fraction of a small impurity element is chosen by the formula $1-x$;
a pair of source/drain regions of a second conductivity type located substantially within the first conductivity type semiconductor region, wherein the pair of source/drain regions include at least a second pair of impurity elements, wherein at least one of the second pair of impurity elements includes a second conductivity type dopant element, wherein a fraction of a large impurity element in the second pair of impurity elements is chosen by the formula $x=(R_H-R_S)/[(R_L-R_H)+(R_H-R_S)]$ and a fraction of a small impurity element is chosen by the formula $1-x$;
wherein there is substantially no lattice stress in the first conductivity type semiconductor region or the pair of source/drain regions;
a channel region located between the pair of source/drain regions; and
a gate located adjacent to the channel region.

14. The transistor of claim 13, wherein the first conductivity type semiconductor region includes at least a pair of dopant elements of the same conductivity type.

15. The transistor of claim 13, wherein the first conductivity type semiconductor region includes at least a pair of dopant elements of an opposite conductivity type.

16. The transistor of claim 13, wherein the first conductivity type semiconductor region includes at least one dopant element and at least one electrically inactive element.

17. A memory device, comprising:
a plurality of memory cells, each cell including a charge storage device and an access transistor, wherein at least one access transistor includes:
a first conductivity type semiconductor region, wherein the first conductivity type semiconductor region includes a first group of three or more impurity elements, wherein at least one of the first group of impurity elements includes a first conductivity type dopant element, wherein the first group of impurity elements have complementary radii in respective amounts where a weighted average dopant atomic radius in the first group of impurity elements is substantially equal to an average atomic radius of an undoped host semiconductor lattice;
a pair of source/drain regions of a second conductivity type located substantially within the first conductivity type semiconductor region, wherein the pair of source/drain regions include a second group of three or more impurity elements, wherein at least one of the second group of impurity elements includes a second conductivity type dopant element, wherein the second group of impurity elements have complementary radii in respective amounts where a weighted average dopant atomic radius in the second group of impurity elements is substantially equal to an average atomic radius of an undoped host semiconductor lattice;
wherein there is substantially no lattice stress in the first conductivity type semiconductor region or the pair of source/drain regions;
a channel region located between the pair of source/drain regions; and
a gate located adjacent to the channel region.

18. The memory device of claim 17, wherein the charge storage device includes a capacitor.

19. The memory device of claim 17, wherein the first conductivity type semiconductor region includes at least a pair of dopant elements of the same conductivity type.

20. The memory device of claim 17, wherein the first conductivity type semiconductor region includes at least a pair of dopant elements of an opposite conductivity type.

21. The memory device of claim 17, wherein the first conductivity type semiconductor region includes at least one dopant element and at least one electrically inactive element.

22. An electronic system, comprising:
a memory device including a plurality of transistors, wherein at least one transistor includes:
a first conductivity type semiconductor region, wherein the first conductivity type semiconductor region includes a first group of three or more impurity elements, wherein at least one of the first group of impurity elements includes a first conductivity type dopant element, wherein the first group of impurity elements are chosen with complementary radii in respective amounts where a weighted average dopant atomic radius in the first group of impurity elements is substantially equal to an average atomic radius of an undoped host semiconductor lattice;
a pair of source/drain regions of a second conductivity type located substantially within the first conductivity type semiconductor region, wherein the pair of source/drain regions include a second group of three or more impurity elements, wherein at least one of the second group of impurity elements includes a second conductivity type dopant element, wherein the second group of impurity elements are chosen with complementary radii in respective amounts where a weighted average dopant atomic radius in the second group of impurity elements is substantially equal to an average atomic radius of an undoped host semiconductor lattice;
wherein there is substantially no lattice stress in the first conductivity type semiconductor region the pair of source/drain regions;
a channel region located between the pair of source/drain regions;
a gate located adjacent to the channel region; and
a processor device coupled to receive data from the memory device.

23. The electronic system of claim 22, wherein the memory device includes a dynamic random access memory device.

24. The electronic system of claim 22, wherein the first conductivity type semiconductor region includes at least a pair of dopant elements of the same conductivity type.

25. The electronic system of claim 22, wherein the first conductivity type semiconductor region includes at least a pair of dopant elements of an opposite conductivity type.

26. The electronic system of claim 22, wherein the first conductivity type semiconductor region includes at least one dopant element and at least one electrically inactive element.

* * * * *

UNITED STATES PATENT AND TRADEMARK OFFICE
CERTIFICATE OF CORRECTION

PATENT NO. : 7,301,221 B2 Page 1 of 1
APPLICATION NO. : 11/217776
DATED : November 27, 2007
INVENTOR(S) : Farrar et al.

It is certified that error appears in the above-identified patent and that said Letters Patent is hereby corrected as shown below:

In column 11, line 47, in Claim 1, after "first" insert -- conductivity type dopant element, and --.

In column 11, line 53, in Claim 1, after "lattice;" insert -- and --.

In column 11, line 58, in Claim 1, after "elements," insert -- wherein at least one of the second group of impurity elements includes a second conductivity type dopant element, and --.

In column 11, line 59, in Claim 1, after "wherein" delete "in".

In column 14, line 58, in Claim 22, after "region" insert -- or --.

Signed and Sealed this

Twenty-ninth Day of April, 2008

JON W. DUDAS
*Director of the United States Patent and Trademark Office*